(12) United States Patent
Matsumura et al.

(10) Patent No.: US 7,755,142 B2
(45) Date of Patent: Jul. 13, 2010

(54) THIN-FILM TRANSISTOR AND IMAGE DISPLAY DEVICE

(75) Inventors: Mieko Matsumura, Kokubunji (JP); Mutsuko Hatano, Kokubunji (JP); Mitsuhide Miyamoto, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 11/761,930

(22) Filed: Jun. 12, 2007

(65) Prior Publication Data

US 2008/0012023 A1 Jan. 17, 2008

(30) Foreign Application Priority Data

Jul. 12, 2006 (JP) .............................. 2006-191176

(51) Int. Cl.
*H01L 27/01* (2006.01)
(52) U.S. Cl. ...................... 257/354; 257/343; 257/342; 257/401; 257/E29.023

(58) Field of Classification Search ................. 257/354, 257/341–343, 401; 438/149–151
See application file for complete search history.

(56) References Cited

U.S. PATENT DOCUMENTS 5,689,129 A * 11/1997 Pearce .......................... 257/341
2004/0126940 A1 * 7/2004 Inoue ........................... 438/149

FOREIGN PATENT DOCUMENTS

JP 7-326764 A 12/1995

* cited by examiner

*Primary Examiner*—Dung A. Le
(74) *Attorney, Agent, or Firm*—Miles & Stockbridge P.C.

(57) ABSTRACT

In either of a source side and a drain side of an insular semiconductor thin film, a gate electrode is extended without a break along the contour of the insular semiconductor thin film to provide a branch closed circuit, thereby removing a current component path to server as a sub-channel in the edge of the insular semiconductor thin film, in order to eliminate current components due to the concentration of a gate electric field in silicon thin-film edges occurring in edges of an insular semiconductor thin film of top gate type thin-film transistors and a shift of threshold due to fixed charges in the periphery of the silicon thin-file edges.

5 Claims, 17 Drawing Sheets

THIN-FILM TRANSISTOR AND IMAGE DISPLAY DEVICE

CLAIM OF PRIORITY

The present application claims priority from Japanese application JP 2006-191176 filed on Jul. 12, 2006, the content of which is hereby incorporated by reference into this application.

FIELD OF THE INVENTION

The present invention relates to thin-film transistors and an image display device that employs the thin-film transistors in pixel circuits and driving circuits. More particularly, the present invention is suitable for liquid crystal display devices with high definition and rapid display capability, and flat panel image display devices such as organic EL display devices.

In flat panel image display devices of the active matrix system such as liquid crystal display devices and organic EL display devices, thin-film transistors are used for switching elements of pixel circuits and peripheral circuits including a driving circuit. Channels of the thin-film transistors are often constructed with amorphous silicon thin films and polycrystalline silicon thin films.

The structures of thin-film transistors fall into two major categories: a bottom gate type that a gate electrode is in a layer (substrate side) lower than a channel, and a top gate type that a gate electrode is in a layer upper than a channel. Amorphous silicon thin film transistor are often of the bottom gate type, and polycrystalline silicon thin film transistors are of the bottom gate type and the top gate type.

The top gate type structure have advantages that a polycrystalline silicon film can be efficiently formed because of a small amount of heat dissipation during its formation by laser radiation, and a source and a drain can be formed in a self alignment manner for a gate electrode.

In top gate type thin-film transistors, a semiconductor thin film is insularly processed, a gate insulating film and a metallic film are deposited over it, and the metallic film is processed in a shape that crosses the insular semiconductor thin film to form a gate electrode. Therefore, generally, as shown in FIG. 1, the gate electrode GT gets over edges P1-P2 and P3-P4 of the insular semiconductor thin film SEMI-L.

In the edges (get-over parts) P1-P2 and P3-P4 of the insular semiconductor thin film, it is easy to form a thin film because the gate insulating film is formed in a stepped shape, and fixed electric charges are liable to occur because of damage by electrification during fabrication. As a result, local threshold in the edges P1-P2 and P3-P4 tend to become lower than threshold in the central part of the semiconductor thin film. FIG. 2 shows a conceptual drawing of current-voltage characteristics when edge current components are not negligible. In FIG. 2, the curve A indicates current-voltage characteristics in the central part of the semiconductor thin film, and the curve B indicates current-voltage characteristics in the edges of the semiconductor thin film.

When the edge current component flows at a voltage that causes a thin-film transistor to turn off, image display is disturbed and power consumption increases. As measures against it, threshold can be adjusted by ion implantation to increase threshold in flat portions and edges. However, in this case, a current in on state decreases, and a driving voltage of peripheral circuits to require currents must be boasted, with the result that power consumption of the image display device increases. Therefore, to reduce power consumption of the image display device, current components of the semiconductor thin-film edge must be sufficiently suppressed.

JP-A No. 7(1995)-326764 refers to the current component of the semiconductor thin-film edge as an edge current component and proposes the following measures. Specifically, by making a gate length of the gate electrode overlapping with the contour of the insular semiconductor thin film longer than a gate length inside a portion overlapping with the contour of the insular semiconductor thin film, edge conduction is suppressed. This measure is excellent in that edge conduction can be reduced simply by changing layout.

However, in the prior art, although edge currents can be reduced, there is no effect of eliminating the edge currents. The reason is described below. FIG. 3 is a drawing showing the channel length dependency of drain current-gate voltage characteristics of thin-film transistors calculated using a two-dimensional device simulator. In FIG. 3, a horizontal axis indicates gate voltages (V), and a vertical axis indicates logarithmic expression of drain currents A/μm. Here, calculations are made on the assumption that the film thickness of silicon thin film is 50 nanometers (nm) and the film thickness of gate oxide film is 100 nm. It will be understood from FIG. 3 that if channel length CHL is doubled from 4 microns (μm) to 8 (μm), a drain current is halved. However, the voltage when currents rise is little changed.

To correct a shift in threshold of semiconductor thin-film edges by a decrease in currents, the currents must be suppressed by orders of magnitude. To do this, channel length must be lengthened by orders of magnitude, so that difficulty in circuit layout occurs. Therefore, when there is a shift in threshold of semiconductor thin-film edges, it is difficult to eliminate the component by extending edge channel length.

When extension of edge channel length is applied to pixel switch thin-film transistors, aperture ratio decreases because the gate electrode portion does not transmit light, so that image display capability decreases.

A first object of the present invention is to provide a thin-film transistor that suppresses an increase in driving voltages by eliminating current components flowing through an insular semiconductor edge of a top gate type thin-film transistor.

A second object of the present invention is to realize an image display device of flat panel type that is excellent in image display capability and low in power consumption by reducing driving voltages of peripheral circuit without reducing aperture ratio.

For the first object, the present invention eliminates an edge current path (side channel) occurring in intersections between a gate electrode and the edges of an insular semiconductor thin film, aside from a channel between a source and a drain of a thin-film transistor. Specifically, in one or both of a source electrode formation portion (source side) and a drain electrode formation portion (drain side) disposed on both sides of a gate electrode disposed across an insular semiconductor thin film to form an active layer of the thin-film transistor on an upper layer of a central part of the insular semiconductor thin film, a branch closed circuit is provided which lies along a side edge that branches from the gate electrode and forms the contour of the insular semiconductor thin film, and goes around the side edge so as to cover it. By this edge current suppression structure, by elongating part of the gate electrode without a break along the contour of the insular semiconductor thin film to form the branch closed circuit, a path through which unnecessary drain currents flow is eliminated because a so-called side channel occurring in channel semiconductor thin-film edges is removed.

For the first object of the present invention, an edge gate elongation structure is used. In this structure, on one or both of the source side and the drain side on an insular semiconductor thin film, a branch is provided which, along a side edge that branches from a gate electrode and forms part of the contour of the insular semiconductor thin film, elongates so as to cover the side edge and has a free end in a portion distant from a channel region.

For the second object, the present invention uses thin-film transistors to which the above-described branch closed circuit or the edge current suppression structure constructed with the branch is applied, in peripheral circuits including a driving circuit formed outside an image display region. By this construction, an image display device with unnecessary drain currents suppressed and power consumption reduced is realized.

By adopting the edge current suppression structure, a so-called side channel occurring in a semiconductor thin-film edge to form a channel is removed and a path through which unnecessary drain currents flow is eliminated. In this structure, on any one of the above-described source side or drain side, there is provided a branch closed circuit which lies along a side edge that branches from the gate electrode and forms the contour of the insular semiconductor thin film, and goes around the side edge so as to cover it. In other words, part of the gate electrode is elongated without a break along the contour of the insular semiconductor thin film to provide the branch closed circuit.

In thin-film transistors elongated along the contour of a insular semiconductor thin film, that is, thin-film transistors having no intersections between the contour of the insular semiconductor thin film and the contour of a gate electrode on any one of a source side or drain side, a current path is not formed in a channel edge of the semiconductor thin film. Therefore, as the first object of the present invention, the elimination of currents flowing through insular semiconductor edges of top gate type thin-film transistors cannot be achieved.

Thin-film transistors having the edge gate elongation structure have an advantage that an overlap area of a semiconductor thin film and a gate electrode, which acts as parasitic capacitance, can be adjusted although edge current suppression effect decreases in comparison with thin-film transistors employing the branch closed circuit. In the edge gate elongation structure, on one or both of the source side and the drain side on an insular semiconductor thin film, a branch is provided which, along a side edge that branches from a gate electrode and forms part of the contour of the insular semiconductor thin film, elongates so as to cover the side edge and has a free end in a portion distant from a channel region.

To achieve the second object of the present invention, thin-film transistors having no intersections between the contour of an insular semiconductor thin film and the contour of a gate electrode in one of a source side or drain side of the insular semiconductor thin film are used in peripheral circuits including a driving circuit. All thin-film transistors constituting the peripheral circuits may thus be constructed, or only thin-film transistors of the driving circuit particularly requiring currents may thus be constructed. In thin-film transistors having no intersection between the contour of the insular semiconductor thin film and the contour of the gate electrode, since current components of a semiconductor edge to form a channel are eliminated, threshold can be reduced and driving at low voltages is enabled. As a result, power consumption of an image display device can be reduced. In this case, by using conventional thin-film transistors in a pixel circuit (pixel part) in a display region, a driving voltage pf the peripheral circuits can be reduced without reducing the aperture ratio of pixels.

Further, to achieve the second object of the present invention, the concept of using appropriate thin-film transistor structures differently for a pixel part and a peripheral circuit part is applied. According to this concept, for thin-film transistors in peripheral circuits, the edge gate elongation structure is used. In this structure, on one or both of a source side and a drain side on an insular semiconductor thin film, a branch is provided which, along a side edge that branches from a gate electrode and forms part of the contour of the insular semiconductor thin film, elongates so as to cover the side edge and has a free end in a portion distant from a channel region. In this case, the thin-film transistors having this structure have an advantage that an overlap area of a semiconductor thin film and a gate electrode, which acts as parasitic capacitance, can be adjusted although edge current suppression effect decreases in comparison with thin-film transistors employing the branch closed circuit.

DETAILED DESCRIPTION OF THE PREFERRED EMBODIMENTS

Hereinafter, preferred embodiments for implementing the present invention will be described in detail with reference to the accompanying drawings. In embodiments of an image display device, although a glass substrate is used for description as its insulating substrate, the present invention can also apply to image display devices that employ a plastic substrate.

First Embodiment

Figure 4:
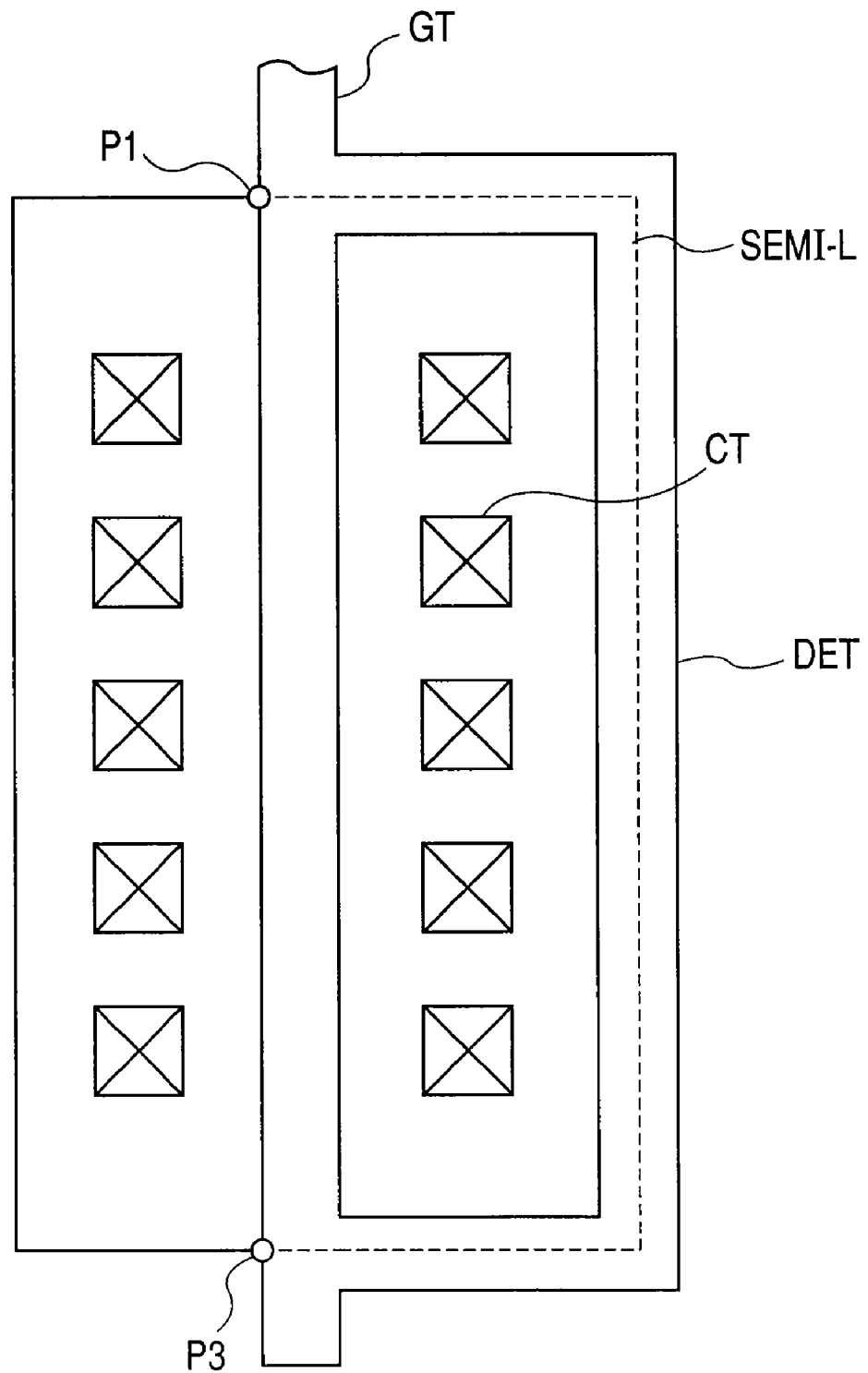
FIG. 4 is an upper surface view of a main portion for explaining a thin-film transistor of a first embodiment of the present invention.

FIG. 4 is an upper surface view of a main portion for explaining a thin-film transistor of a first embodiment of the present invention. Toward FIG. 4, a source side is to the left of a gate electrode GT, and a drain side is to the right of it. On a drain electrode formation side on an insular semiconductor thin film SEMI-L, a branch closed circuit DET is provided which lies along a side edge that branches from the gate electrode GT and forms the contour of the insular semiconductor thin film SEMI-L, and goes around the side edge so as to cover it. Specifically, the edge of the drain electrode formation side on the insular semiconductor thin film SEMI-L is covered by the branch closed circuit DET along and on its edge. A structure with the branch closed circuit DET provided in the gate electrode GT is referred to as an edge current suppression structure.

Figure 1:
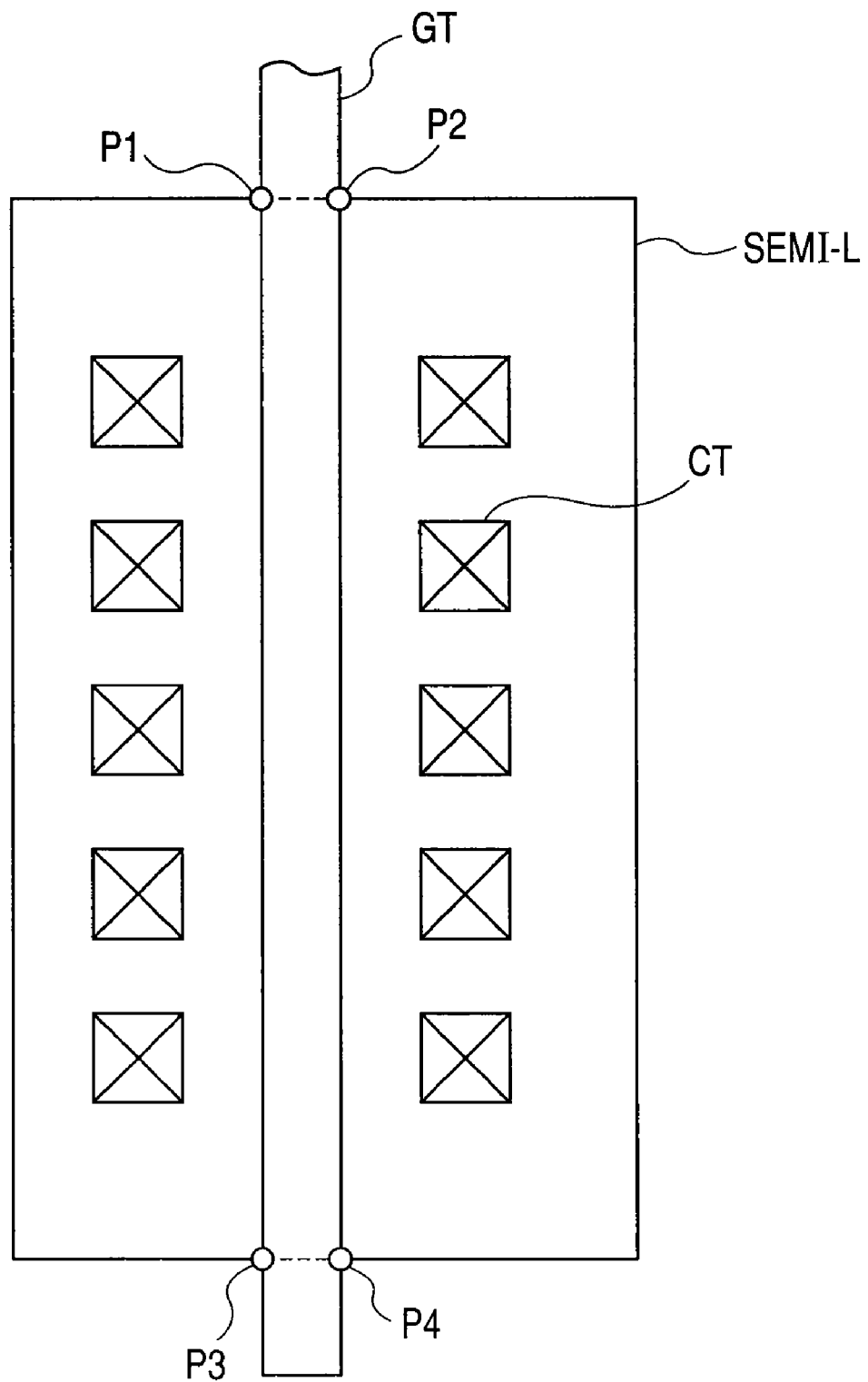
FIG. 1 is a drawing for explaining side channels occurring in intersections between an insular semiconductor thin film of thin-film transistors and gate electrodes.
Figure 2:
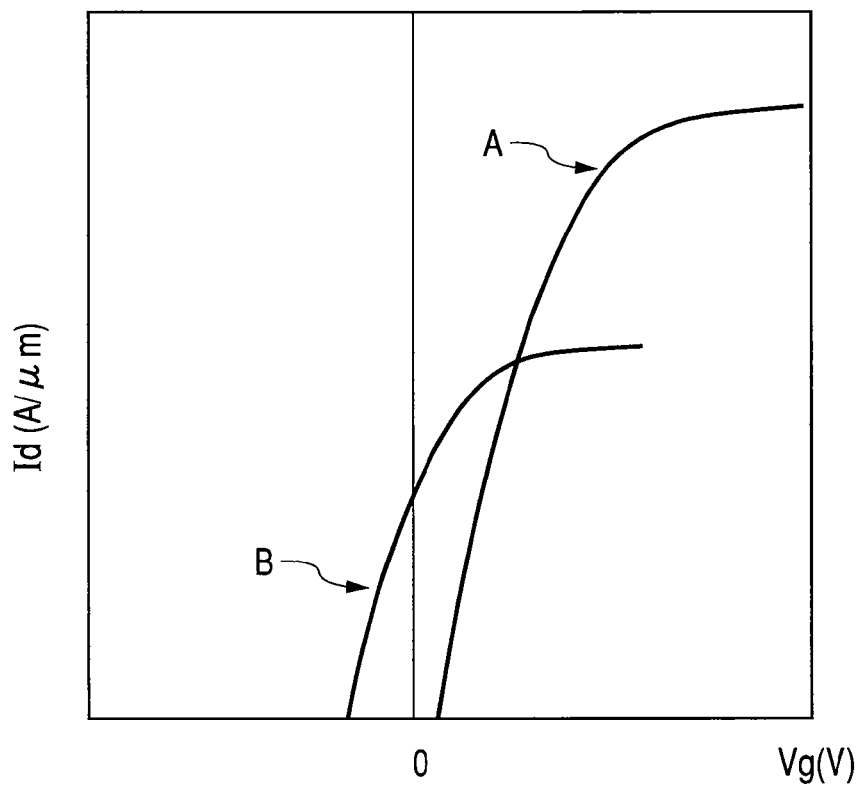
FIG. 2 is a conceptual drawing of current-voltage characteristics when edge current components are not negligible.
Figure 3:
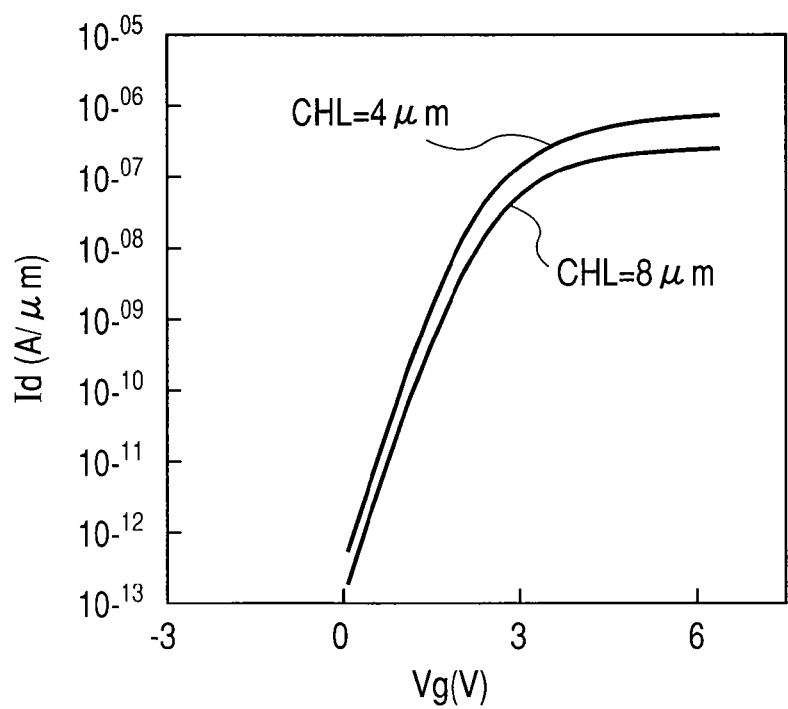
FIG. 3 is a drawing showing the channel length dependency of drain current-gate voltage characteristics of thin-film transistors calculated using a two-dimensional device simulator.

In thin-film transistors of the prior art, as shown in FIG. 1, intersections between the edge part of the insular semiconductor SEMI-L and the contour of the gate electrode GT are four points P1, P2, P3, and P4. An edge current component flows from a start point P1 to and end point P2, and from a start point P3 to and end point P4.

On the other hand, in the thin-film transistor of the first embodiment shown in FIG. 4, there are only two intersections P1 and P3, and the end points P2 and P4 of an edge current path in FIG. 1 do not exist. Because of this construction, the number of intersections between the edge part of the insular semiconductor SEMI-L and the contour of the gate electrode GT decreases from four points to two points. Thus, the thin-film transistor structure of the first embodiment causes an edge current or side channel current to be eliminated, contributing to the elimination of the edge current component.

The thin-film transistor may be provided with a body terminal to suppress a parasitic bipolar component. The parasitic bipolar component is a current component generated by the operation of a source body drain similar to that of a bipolar transistor because carriers opposite in polarity to conduction carriers stay in a region near the source and near the substrate of a channel (body) as a result of impact ionization when a high voltage is applied between the drain and the source, and boost a body potential. The current component is undesirable because it cannot be controlled by gate voltages. Accordingly, one method is to provide a body draw-out terminal in the channel to fix body potentials. The branch closed circuit of the present invention is effective also for such thin-film transistors provided with a body terminal.

The same edge current suppression structure as described above may be provided also on the source side on the insular semiconductor thin film SEMI-L, or the edge current suppression structure may be provided only on the source side. In the drawing, a symbol CT designates a contact hall for connecting the source electrode and the drain electrode. Plural source electrodes or plural drain electrodes are provided in upper regions of the insular semiconductor thin film surrounded by the gate electrodes GTs and the branch closed circuit DET, and plural thin-film transistors can be formed on one insular semiconductor thin film.

Second Embodiment

Figure 5:
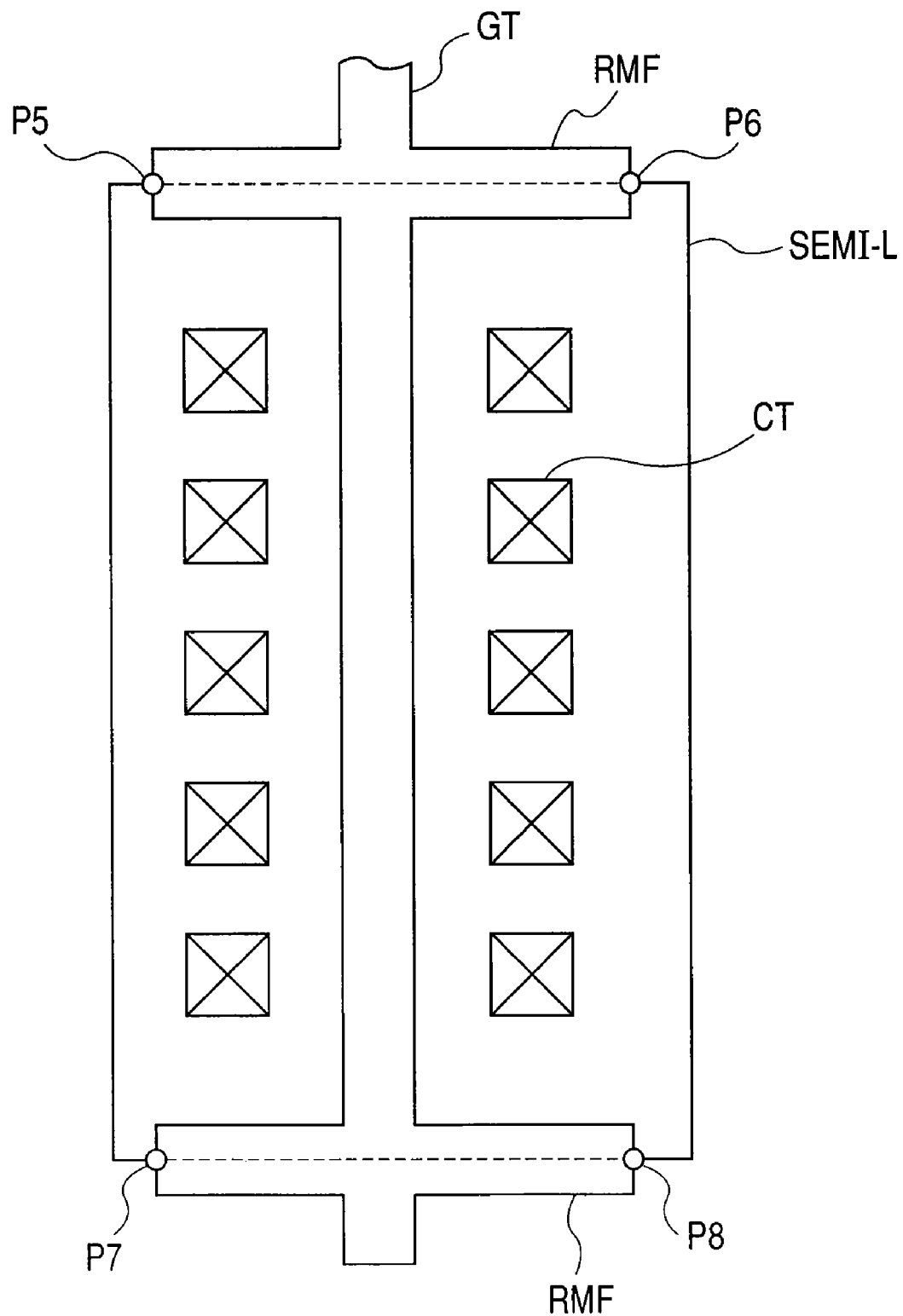
FIG. 5 is an upper surface view of a main portion for explaining a thin-film transistor of a second embodiment of the present invention.

FIG. 5 is an upper surface view of a main portion for explaining a thin-film transistor of a second embodiment of the present invention. Like the first embodiment, toward FIG. 5, a source side is to the left of the gate electrode GT, and a drain side is to the right of it. On a drain electrode formation side and a source electrode formation side on the insular semiconductor thin film SEMI-L, branch RMFs are formed which lie along upper and lower side edges that branch from the gate electrodes GT and form the contour of the insular semiconductor thin film SEMI-L, and elongate so as to cover the side edges. In the second embodiment, an edge current suppression structure provided with the branch RMF is referred to as an edge channel elongation structure.

In FIG. 5, the branch RMFs are elongated along the two upper and lower sides crossing the gate electrodes GT of the insular semiconductor thin film SEMI-L in a form such as to cross the gate electrodes GTs. However, the branch RMFs may be further elongated to a portion of both outer sides (sides parallel to the gate electrodes GT) of the insular semiconductor thin film SEMI-L by being bent. Other constructions are the same as those in the first embodiment.

In the thin-film transistor of the second embodiment shown in FIG. 5, intersections between the edge of the insular semiconductor SEMI-L and the contour of the gate electrodes GT are four points P5, P6, P7, and P8. Thus, the number of intersections between the edge of the insular semiconductor SEMI-L and the contour of the gate electrodes GT is four points. However, intersections such as the end points P2 and P4 of an edge current path in FIG. 1 do not exist near the channel. The thin-film transistor structure of second embodiment allows an edge current component or side channel current to be reduced, contributing to reduction in the edge current component.

Third Embodiment

Figure 6A:
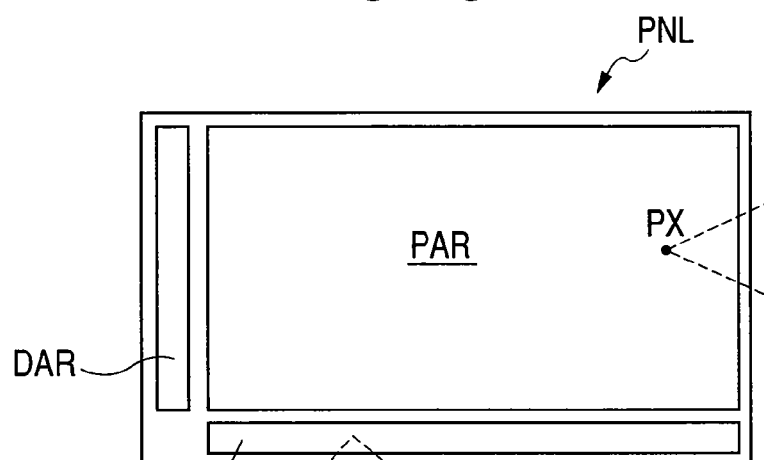
FIGS. 6A, 6B, 6C, and 6D are conceptual views of an image display region and peripheral circuit regions of a thin-film transistor substrate of an image display device illustrating the third embodiment of the present invention.
Figure 6B:
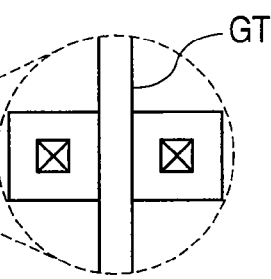
Figure 6C:
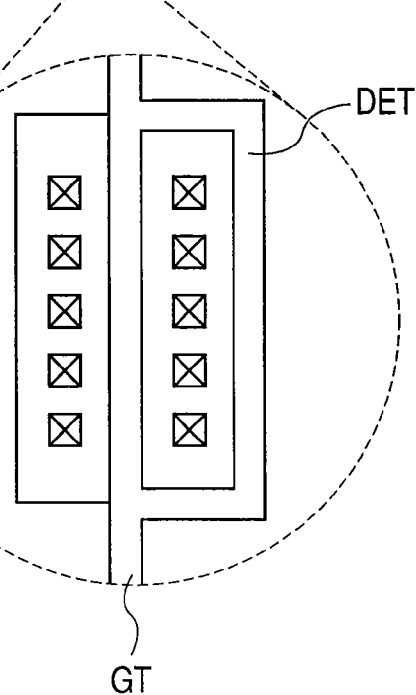
Figure 6D:
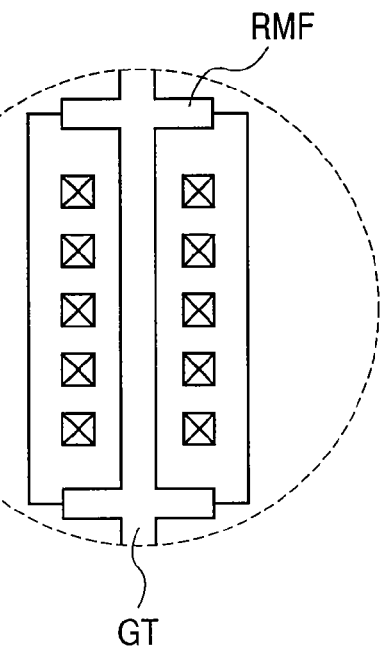
Figure 7:
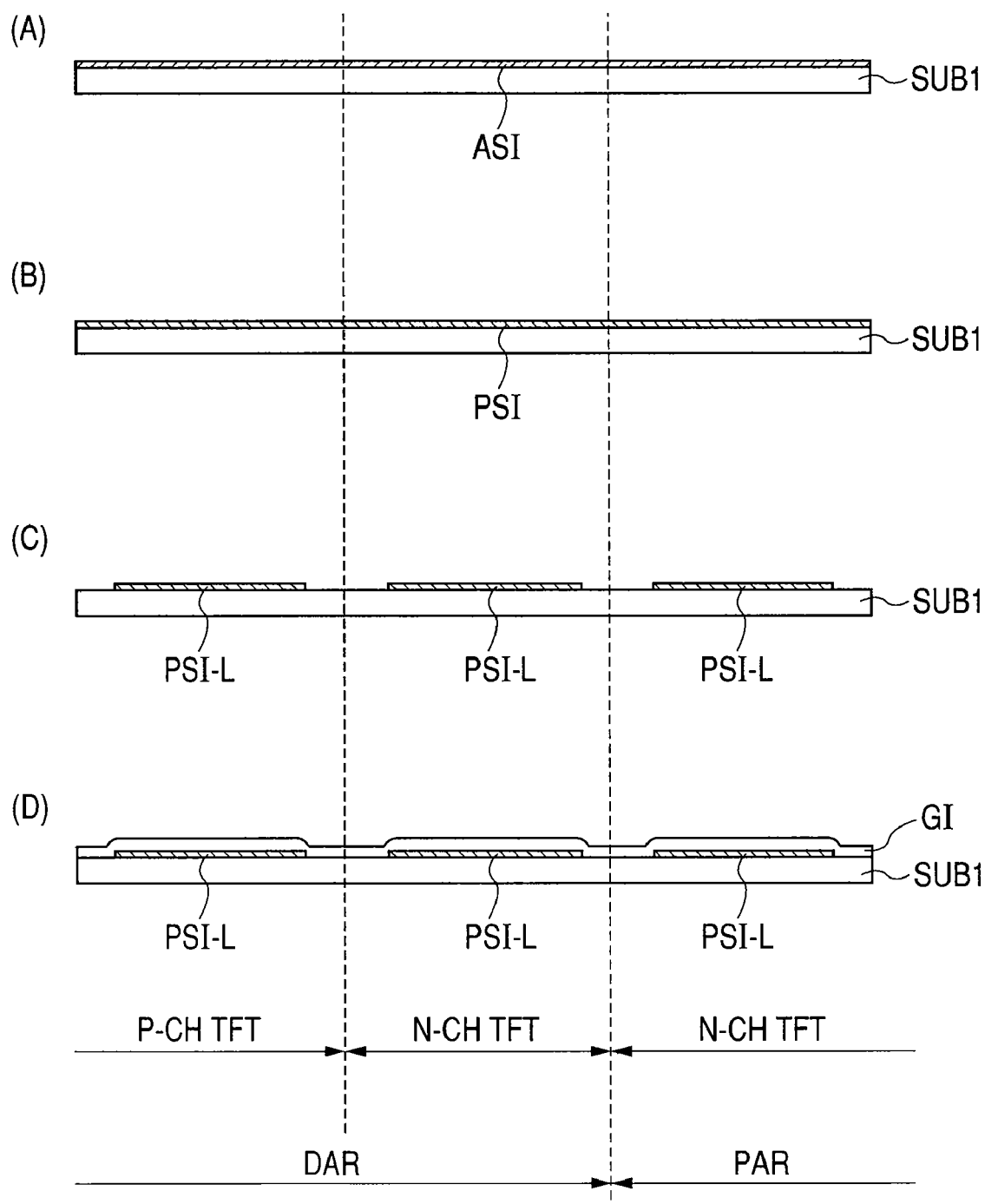
FIGS. 7A to 7D are process diagrams of a method of fabricating a thin-film transistor for explaining a fourth embodiment of the present invention.
Figure 8:
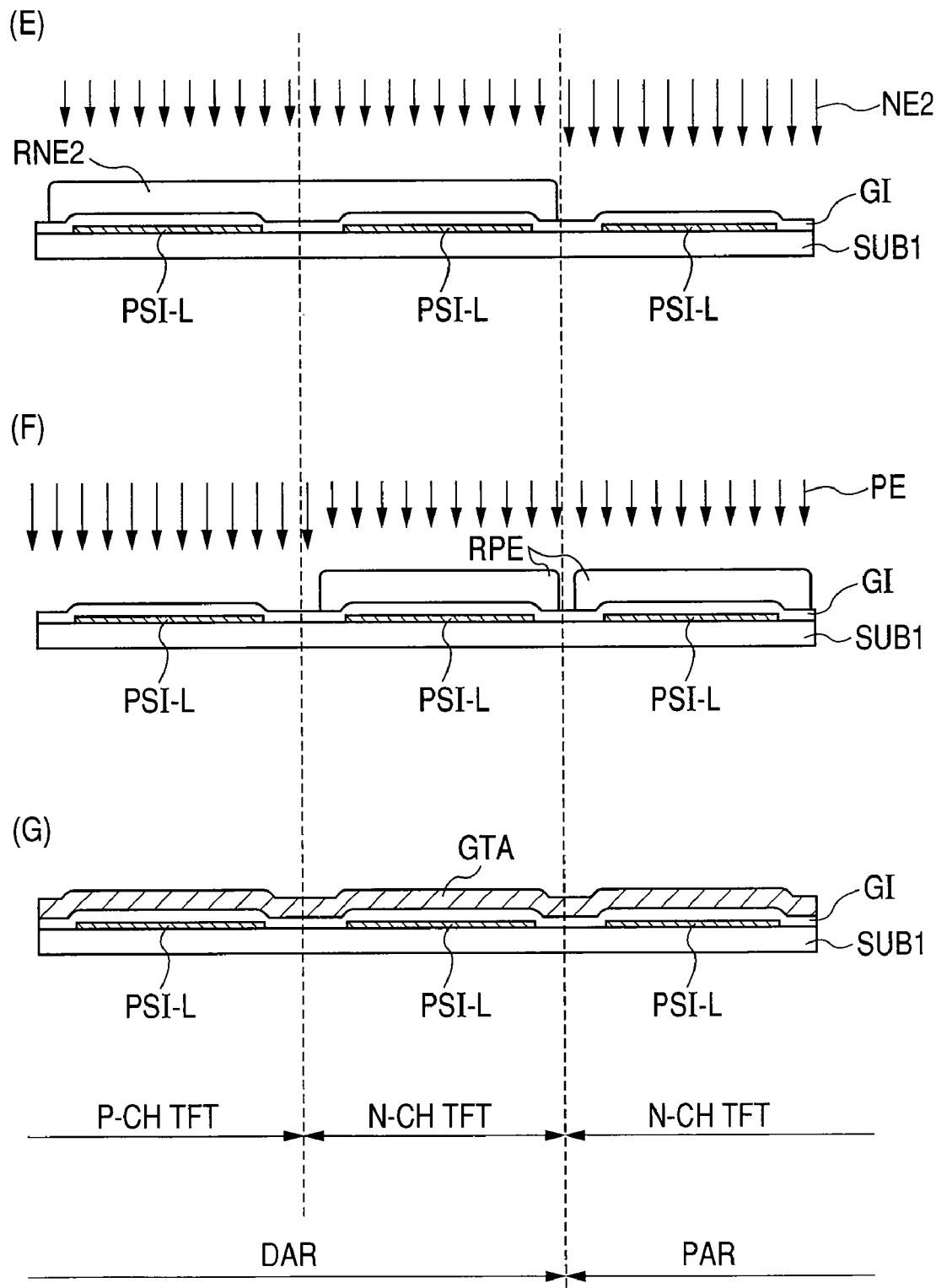
FIGS. 8E, 8F, and 8G are process diagrams continued from FIG. 7 of a method of fabricating a thin-film transistor for explaining a fourth embodiment of the present invention.
Figure 9:
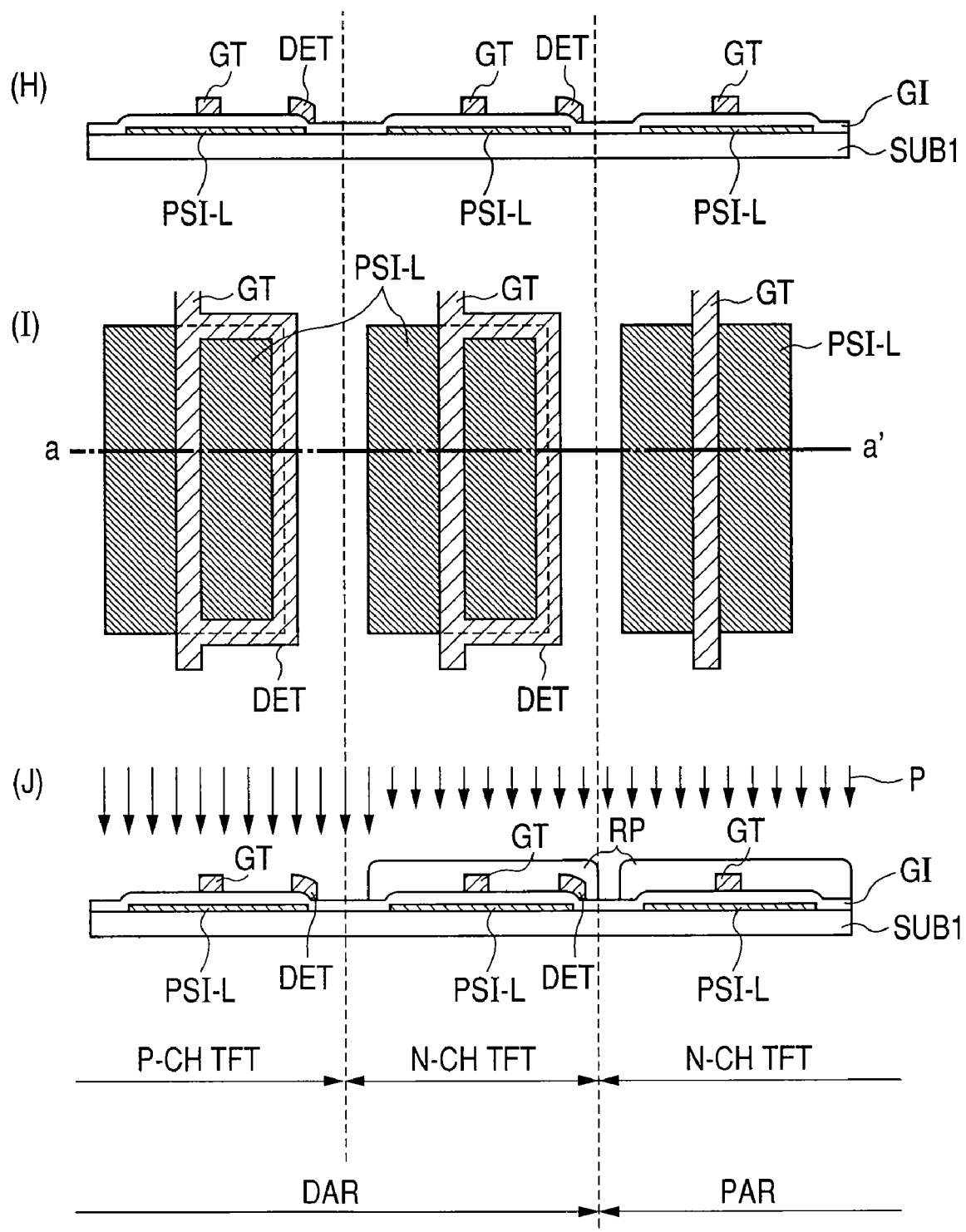
FIGS. 9H, 9I, and 9J are process diagrams continued from FIG. 8 of a method of fabricating a thin-film transistor for explaining a fourth embodiment of the present invention.
Figure 10:
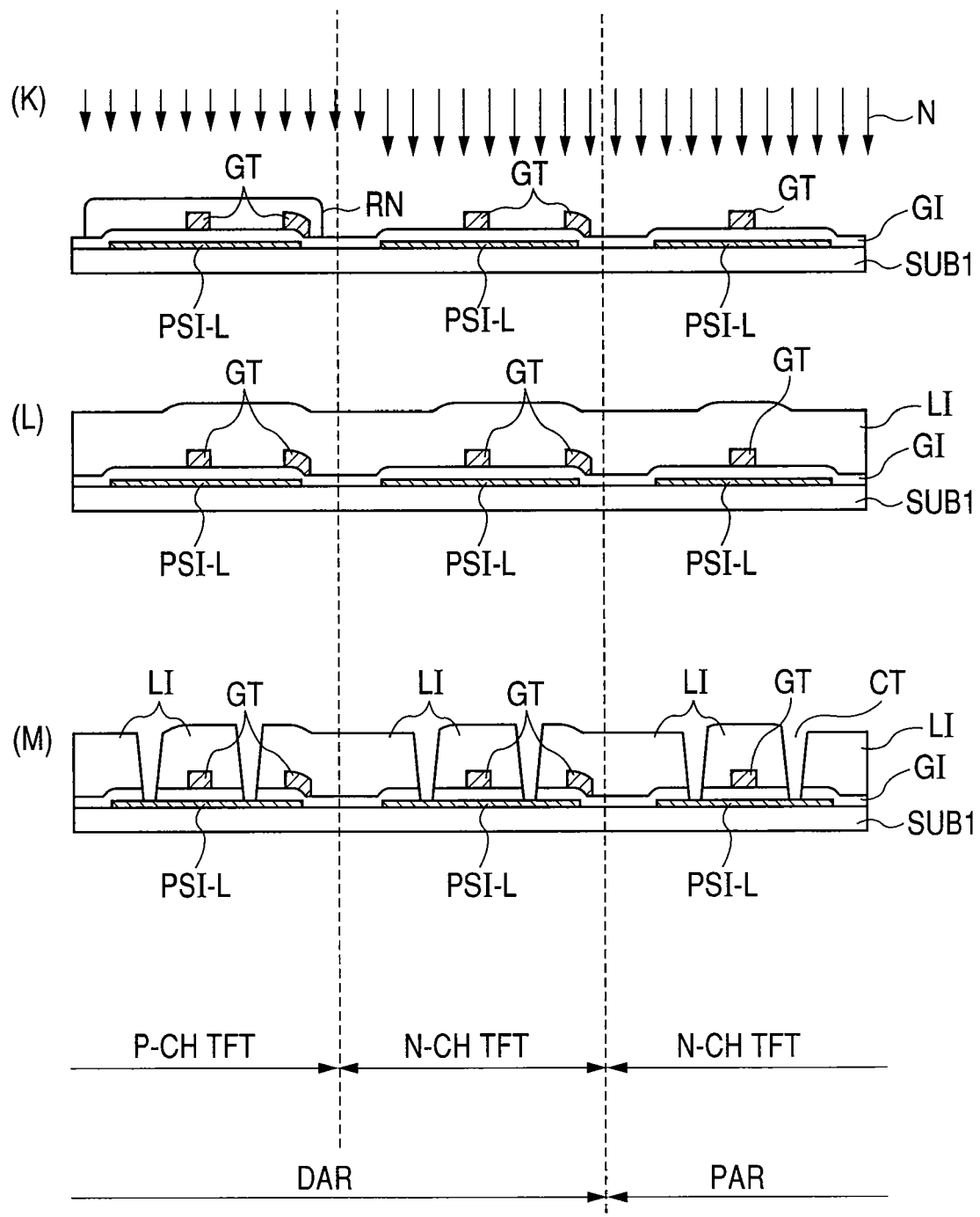
FIGS. 10K, 10L, and 10M are process diagrams continued from FIG. 9 of a method of fabricating a thin-film transistor for explaining a fourth embodiment of the present invention.
Figure 11:
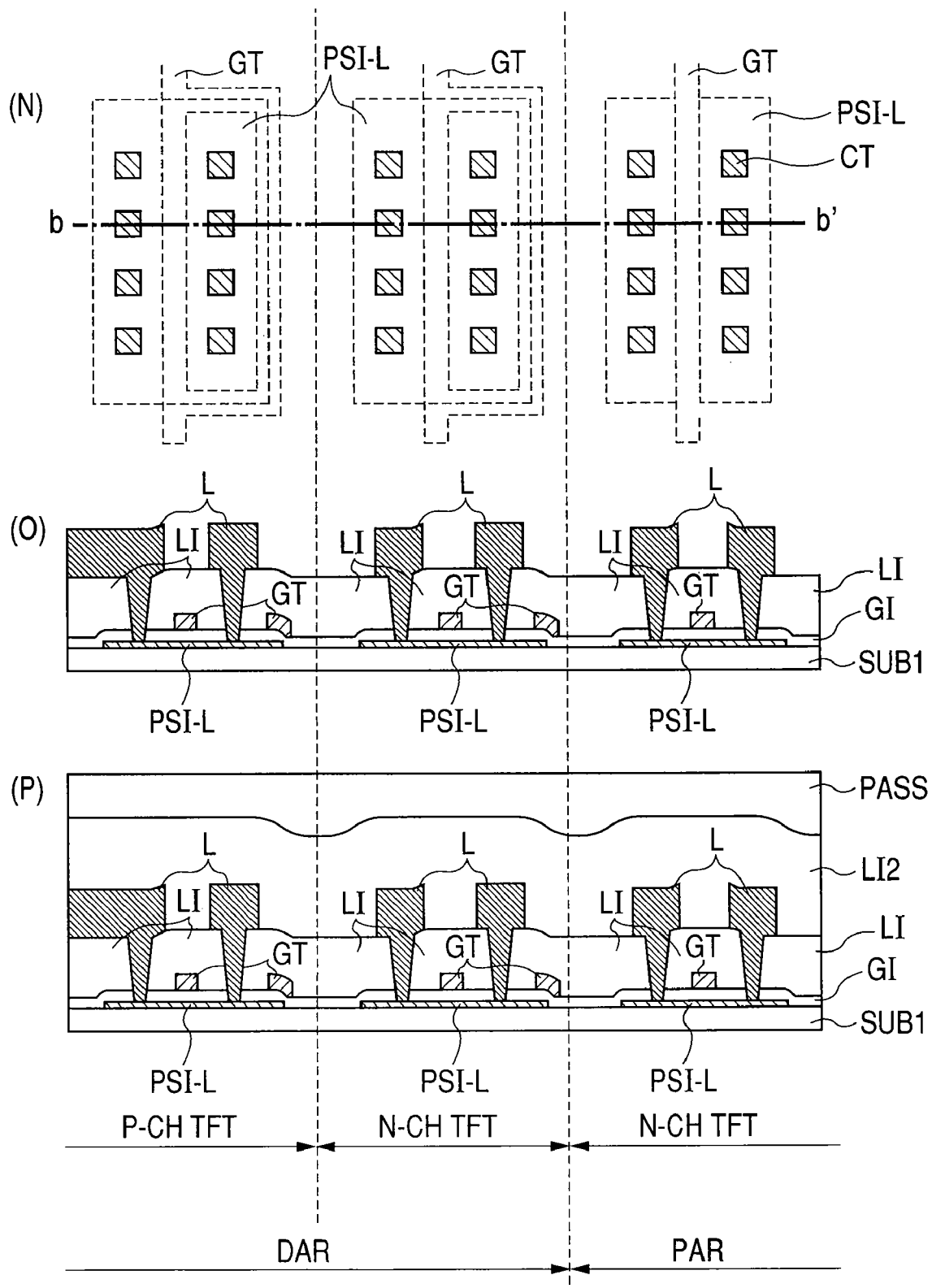
FIGS. 11N, 11O, and 11P are process diagrams continued from FIG. 10 of a method of fabricating a thin-film transistor for explaining a fourth embodiment of the present invention.

The following describes an image display device of the present invention and embodiments of a method of manufacturing a thin-film transistor of the present invention in a third embodiment and following embodiments. FIG. 6 is a conceptual view of an image display region and peripheral circuit regions of a thin-film transistor substrate of an image display device illustrating the third embodiment of the present invention. FIG. 6A is a plan view of a thin-film transistor PNL. FIG. 6B is an enlarged view of a thin-film transistor portion constituting a pixel part of a display region PAR. FIGS. 6C and 6D are enlarged views of thin-film transistor portions constituting peripheral circuits. In the third embodiment, a thin-film transistor to which the edge current suppression structure described in the first and second embodiments is applied is used only in peripheral circuits of the thin-film transistor substrate PNL, particularly a driving circuit.

As the edge current suppression structure, when an edge current is to be eliminated, a thin-film transistor is used in which the gate electrode of FIG. 6C described in the first embodiment is elongated without a break along the contour of the insular semiconductor thin film. When an edge current is only to be decreased, the edge channel elongation structure of FIG. 6D described in the second embodiment is used. In peripheral circuits, a thin-film transistor in which a gate electrode is elongated without a break along the contour of the insular semiconductor thin film, and an edge channel elongation thin-film transistor may be mixed.

In the third embodiment, a thin-film transistor to which the edge current suppression structure described in the first and second embodiments is applied is used in peripheral circuits of the thin-film transistor substrate PNL, particularly a driving circuit, and conventional thin-film transistors are used in pixel parts of a display region, as shown in FIG. 6B. However, the present invention also allows the use of thin-film transistors having such an edge current suppression structure in peripheral circuits other than the driving circuit, or in the pixel parts of the display region.

Fourth Embodiment

FIGS. 7 to 11 are process drawings of a method of manufacturing a thin-film transistor of a fourth embodiment of the present invention. The manufacturing method is described using an example of a CMOS thin-film transistor. Although a single drain structure is exemplified as a source/drain structure, N-channel thin-film transistors may have LDD (Light Doped Drain) structure or GOLDD (Gate Overlapped Light Doped Drain) structure, and N-channel thin-film transistors may be manufactured by counter doping.

The following describes a series of manufacturing processes of a thin-film transistor of the present invention with reference to FIGS. 7A to 11P. A description is made of an example of an image display device that employs transistors having a gate electrode provided with a branch closed circuit DET as thin-film transistors (P-channel thin-film transistor P-CH TFT and N-channel thin-film transistor N-CH TFT) in peripheral circuit regions DAR and N-channel thin-film transistors N-CH TFT not having the branch closed circuit DET as thin-film transistors in the display area PAR.

FIG. 7A: As an insulating substrate to serve as an active matrix substrate, that is, a thin-film transistor substrate, a heat resisting glass substrate SUB1 that is about 0.2 to 1.0 mm thick and preferably almost free of deformation and contraction for thermal processing of 400 to 600° C. is provided. Preferably, on a principal surface of the glass substrate SUB1, a SIN film about 140 nm thick and a SIO film about 100 nm thick that function as thermal and chemical barrier films are deposited continuously and evenly by the CVD method. An amorphous silicon film ASI is formed on the glass substrate SUB1 by means such as the CVD method.

FIG. 7B: Scanning excimer laser beams melts and crystallizes the amorphous silicon film ASI, and modifies the entire amorphous silicon film ASI on the glass substrate SUB1 into a polycrystalline silicon film, that is, a polysilicon film PSI.

Instead of the excimer laser beams, as another method, a Cat-CVD film and a SiGe film that serve as a polysilicon film during crystallization by solid pulsed laser annealing or formation of a silicon film may be adopted. Metal-oxide semiconductors or other semiconductor thin films may be used as channels.

FIG. 7C: The polycrystalline silicon film PSI is processed using a photolithographic method, and islands PSI-L in which thin-film transistors are fabricated are formed.

FIG. 7D: A gate insulating film GI is formed to cover the islands PSI-L of the polycrystalline silicon film.

FIG. 8E: First implantation NE for controlling threshold is performed for the whole surface, and then second implantation NE2 for controlling threshold in regions in which in-pixel thin-film transistors are to be formed is performed. The regions to form the peripheral circuits are covered with photoresist RNE2.

FIG. 8F: Implantation PE for controlling threshold in the regions in which P-channel thin-film transistors are formed is performed. The regions in which N-channel thin-film transistors are formed are covered with photoresist RPE.

FIG. 8G: On top of the photoresist RPE, a metal gate film GTA to serve as a gate electrode of the thin-film transistor is formed using the sputtering method or the CVD method.

FIG. 9H: A gate electrode formation region of the metal gate film GTA is patterned by the photolithographic method to form a gate electrode GT. The branch closed circuit DET is patterned at the same time in the gate electrodes GT of the P-channel thin-film transistor P-CH TFT and the N-channel thin-film transistor N-CH TFT in the peripheral circuit region DAR.

FIG. 9I: This drawing is a top view of the substrate structure shown in FIG. 9H. The thin-film transistors in the peripheral circuit region DAR have the gate electrode patterned so that the number of intersections between the insular silicon contour and the gate electrode contour is two points, eliminating a current path of the silicon semiconductor thin-film edge. Here, gate length is 4 microns, the width of the branch closed circuit DET is 4 microns, and the width of an overlap with the insular silicon semiconductor thin film is 2 microns.

In consideration of alignment accuracy, it is desirable that the overlap width is from 0.5 to 2.5 microns, and the width of the pattern of the branch closed circuit DET is from 1 to 5 microns. In the pixel region PAR, to prevent reduction in aperture ratio, the gate electrode GT is patterned so that the number of intersections between the contour of the island silicon semiconductor thin film and the contour of the gate electrode are four points as conventionally.

FIG. 9J: The formation regions of the N-channel thin-film transistors are covered with photoresist RP, and P-type impurity P is implanted in a source-drain formation region of the P-channel thin-film transistor to form a source-drain region of the P-channel thin-film transistor.

FIG. 10K: The formation area of the P-channel thin-film transistor is covered with photoresist RN, and N-type impurity N is implanted in a source-drain formation region of the N-channel thin-film transistor to form a source-drain region of the N-channel thin-film transistor.

FIG. 10L: The photoresist RN is removed and an interlayer insulating film LI is formed by the CVD method and the like. Then, to activate impurities by implantation, heat treatment is performed at 490° C. for one hour in a nitrogen atmosphere.

FIG. 10M: By the photolithographic method, contact holes CT are formed in the interlayer insulating films LI and the gate insulating film GI.

FIG. 11N: This drawing is a top view of the substrate structure shown in FIG. 10M. FIG. 10M is a sectional view of FIG. 11N taken along the line b-b'.

FIG. 11O: A metallic layer is connected between each source and drain of the thin-film transistors via the contact holes, and wirings L are formed.

FIG. 11P: An interlayer insulating film LI2 is formed to cover the wirings L, and further a protection insulating film PASS is formed over it.

By the above processes, the glass substrate serves as an active matrix substrate on which two-intersection thin-film transistors free of a silicon edge current path are formed in the peripheral circuit regions, and four-intersection thin-film transistors having a silicon edge current path are formed in the pixel regions. The active matrix substrate is completed as an image display device through a liquid crystal process or OLED processes described later. The characteristics of the transistors fabricated as described above are described below.

Figure 12:
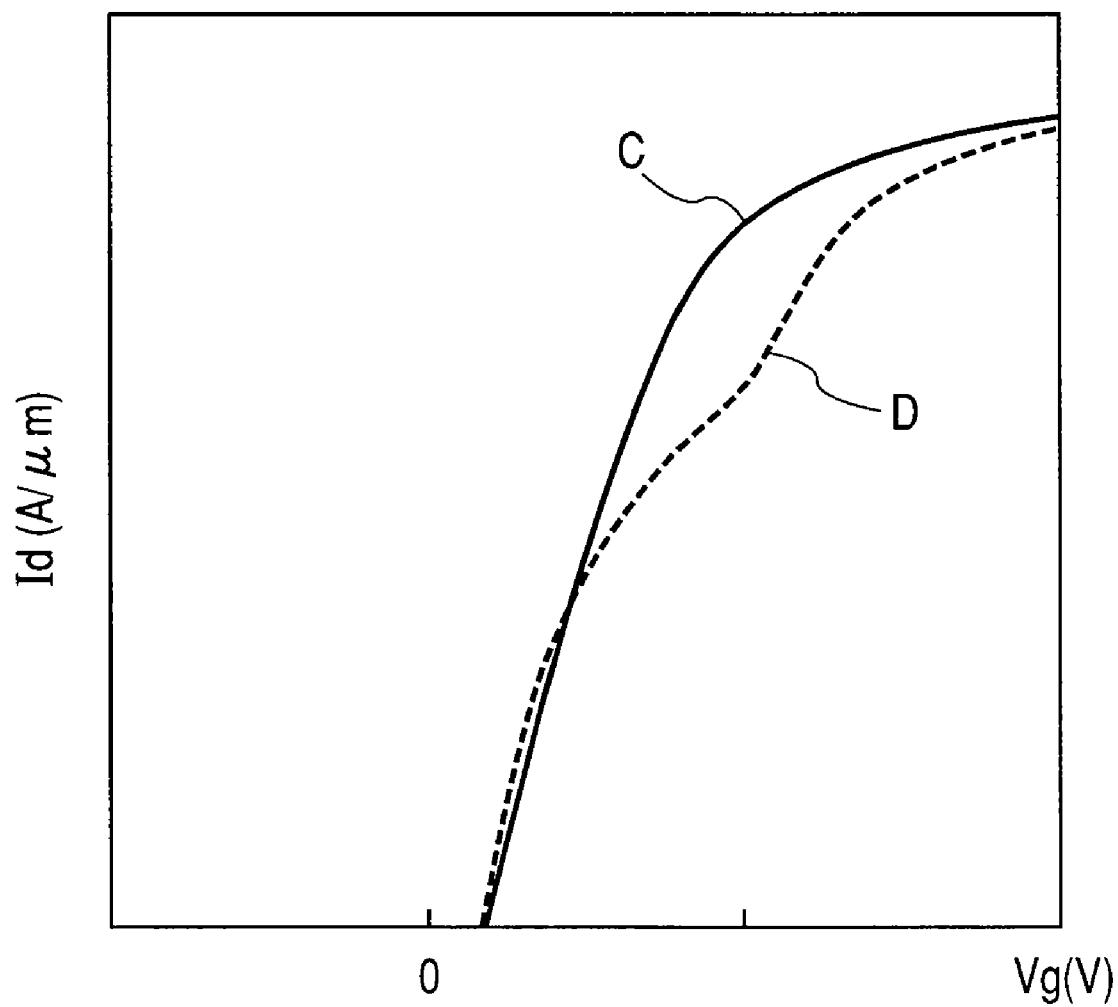
FIG. 12 is a gate voltage-drain current characteristic diagram for explaining demonstration results of the present invention.

FIG. 12 is a gate voltage-drain current characteristic diagram for explaining demonstration results of the present invention. FIG. 12 shows measurement of drain current-gate voltage characteristics of an N-channel thin-film transistor to which the present invention is applied. The thin-film transistor has a channel length of 4 µm and a drain voltage of 0.1 V during measurement.

The curve shown by dotted lines in the drawing represents the characteristics of a thin-film transistor having the same structure as that of conventional ones. Since threshold are low in the silicon semiconductor thin-film edge, an edge current flows at a low gate voltage. Therefore, the characteristic diagram has two humps, including a hump of a channel current in a flat portion.

The solid line C in the drawing shows the characteristics of a thin-film transistor to which a gate electrode shape of the present invention is applied. Since current of the silicon semiconductor thin-film edge has been eliminated, channel threshold in the flat portion can be reduced, and voltage required to obtain the current is lowered in comparison with the case of the dotted curve D. As a result, since voltages for driving the peripheral circuits can be lowered, the effectiveness of the present invention has been demonstrated.

Figure 13:
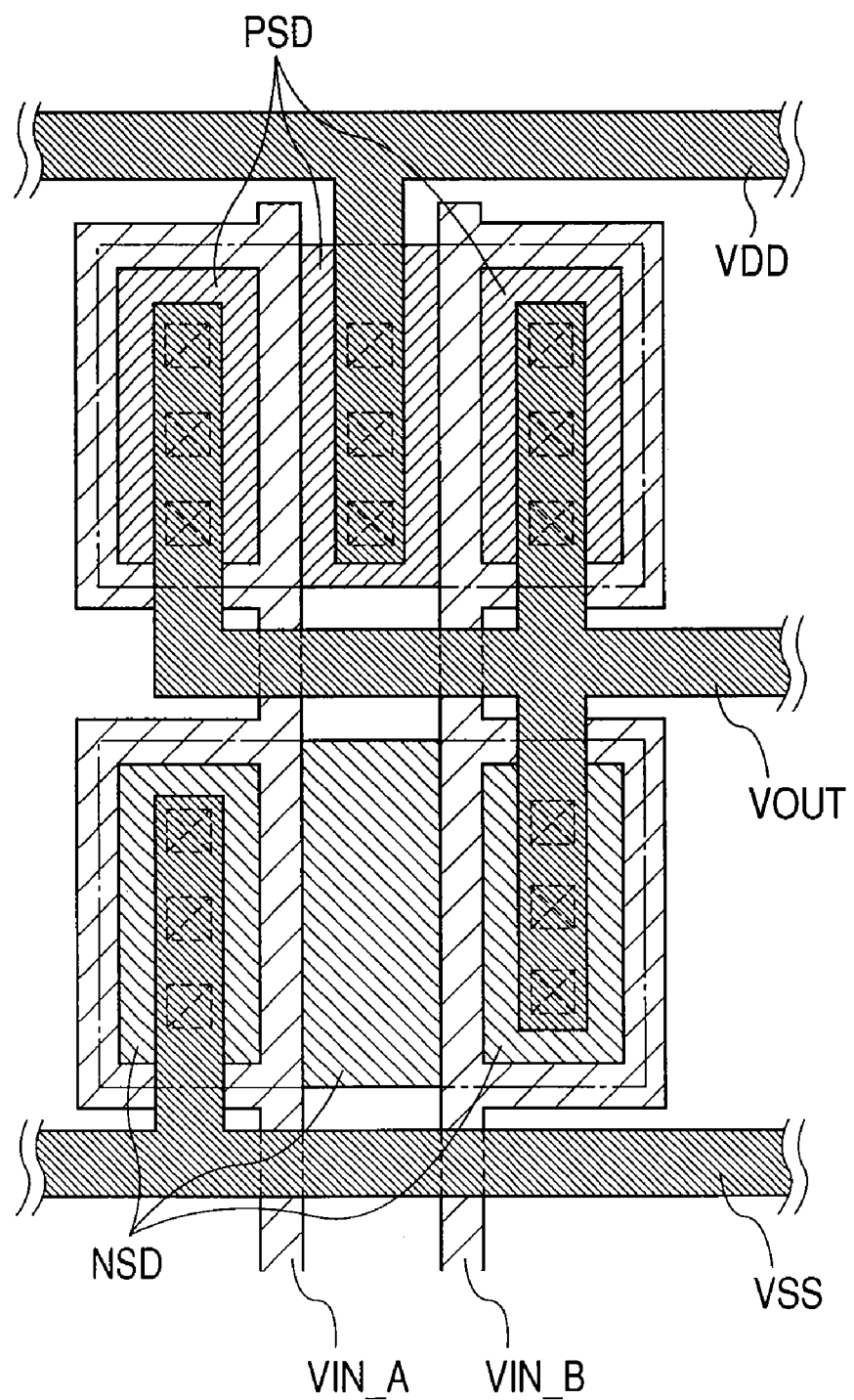
FIG. 13 is a plan view for explaining a layout of a NAND circuit employing thin-film transistors of the present invention.

FIG. 13 is a plan view for explaining a layout of a NAND circuit employing thin-film transistors of the present invention. The NAND circuit controls switching of three P-channel thin-film transistors having P-type source-drain regions and two N-channel thin-film transistors having N-type source-drain regions by signal voltages indicated by VIN_A and VIN_B inputted from gate electrodes, and outputs the potential of one of VDD and VSS from VOUT.

Figure 14:
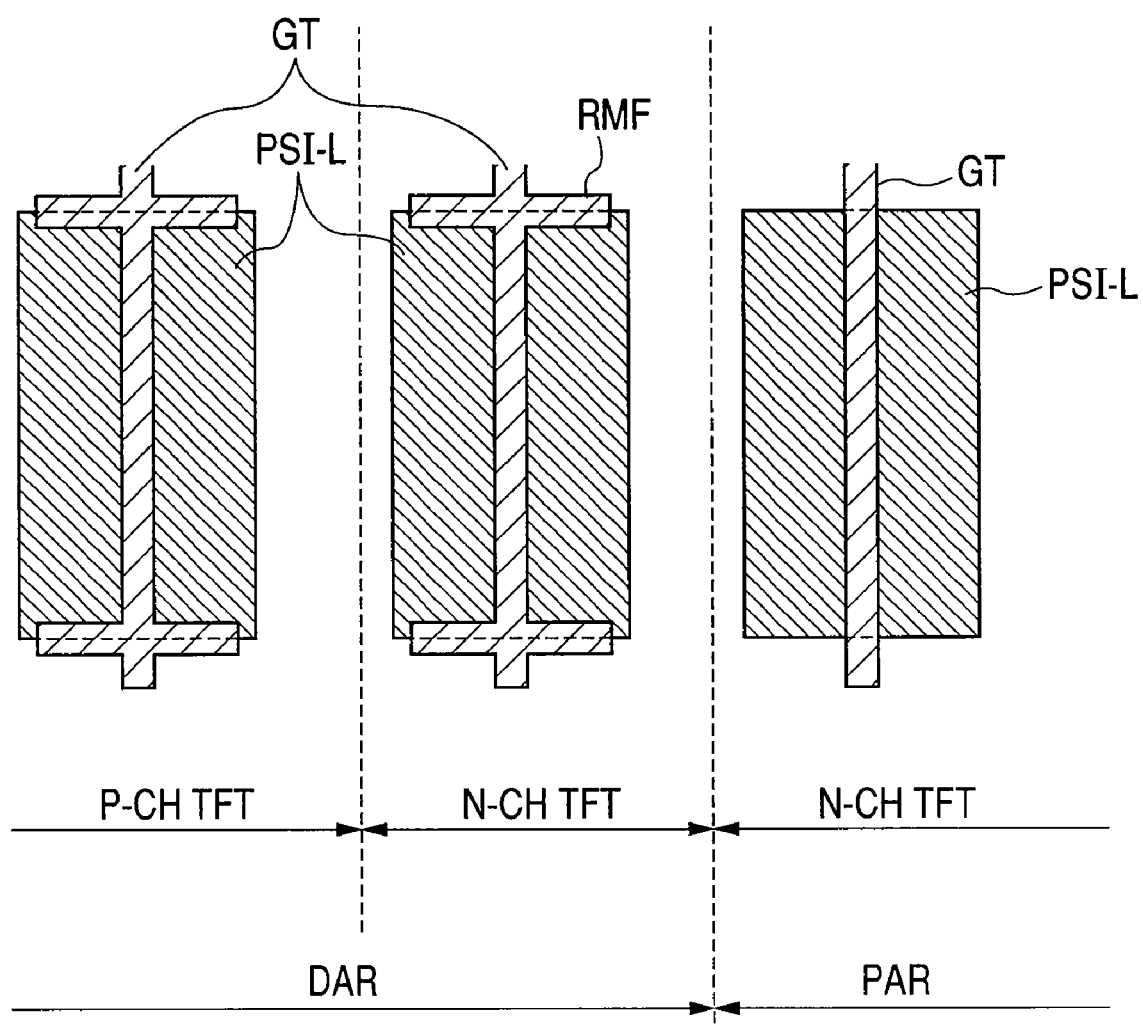
FIG. 14 is a top view of gate electrodes processed immediately before in an image display device employing a second embodiment of thin-film transistors of the present invention.

FIG. 14 is a top view of thin film transistors immediately after formation of the gate electrodes in an image display device employing the second embodiment of thin-film transistors of the present invention. Other fabricating processes are the same as those in the first embodiment. In peripheral circuits, thin-film transistors are used in which a gate length of the gate electrode in portions overlapping with the contour of an insular semiconductor thin film is longer than a gate length inside the portions overlapping with the contour of the insular semiconductor thin film, and in a pixel part, thin-film transistors are used in which a gate length of the gate electrode in portions overlapping the contour of an insular semiconductor thin film is equal to a gate length inside the portions overlapping with the contour of the insular semiconductor thin film. By this construction, a voltage for driving the peripheral circuits can be reduced without reducing the aperture ratio of the pixel part. This circuit has an advantage that the effect of reducing driving voltages decreases in comparison with the circuit used in the first embodiment, but an increase in parasitic capacitance is smaller than in the first embodiment.

Fifth Embodiment

Figure 15:
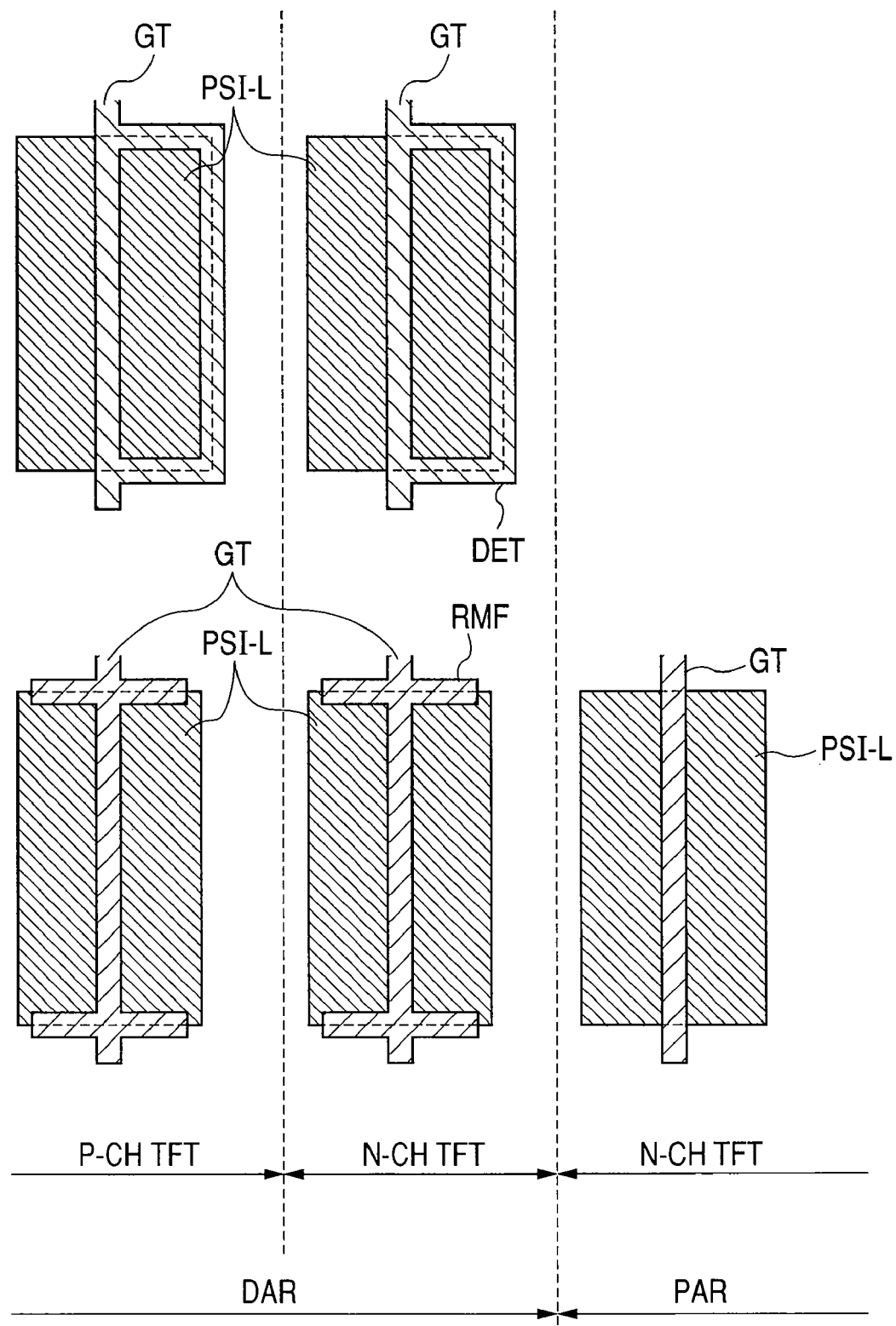
FIG. 15 is a top view of gate electrodes processed immediately before in processes of a method of fabricating thin-film transistors of a fifth embodiment of the present invention.

FIG. 15 is a top view of gate electrodes processed immediately before in processes of a method of fabricating thin-film transistors of a fifth embodiment of the present invention. Other fabricating processes are the same as those in the fourth embodiment. In the peripheral circuit regions DAR, both thin-film transistors that have no intersection between the contour of an insular semiconductor thin film PSI-L and the contour of the gate electrode GT on either of the source side and the drain side, and thin-film transistors in which a gate length of the gate electrode in portions overlapping with the contour of the insular semiconductor thin film GT is equal to gate length inside the portions overlapping with the contour of the insular semiconductor thin film PSI-L are used.

In terms of circuit structure, the thin-film transistors of the present invention are used as described below. Thin-film transistors from which an edge current is particularly to be eliminated are provided with a branch closed circuit DET in one of the source side and the drain side, so that they have no intersections between the contour of the insular semiconductor thin film PSI-L and the contour of the gate electrode GT. Thin-film transistors for which an increase in parasitic capacitance is particularly undesirable are provided with a branch RMF to extend edge gate length.

Figure 16:
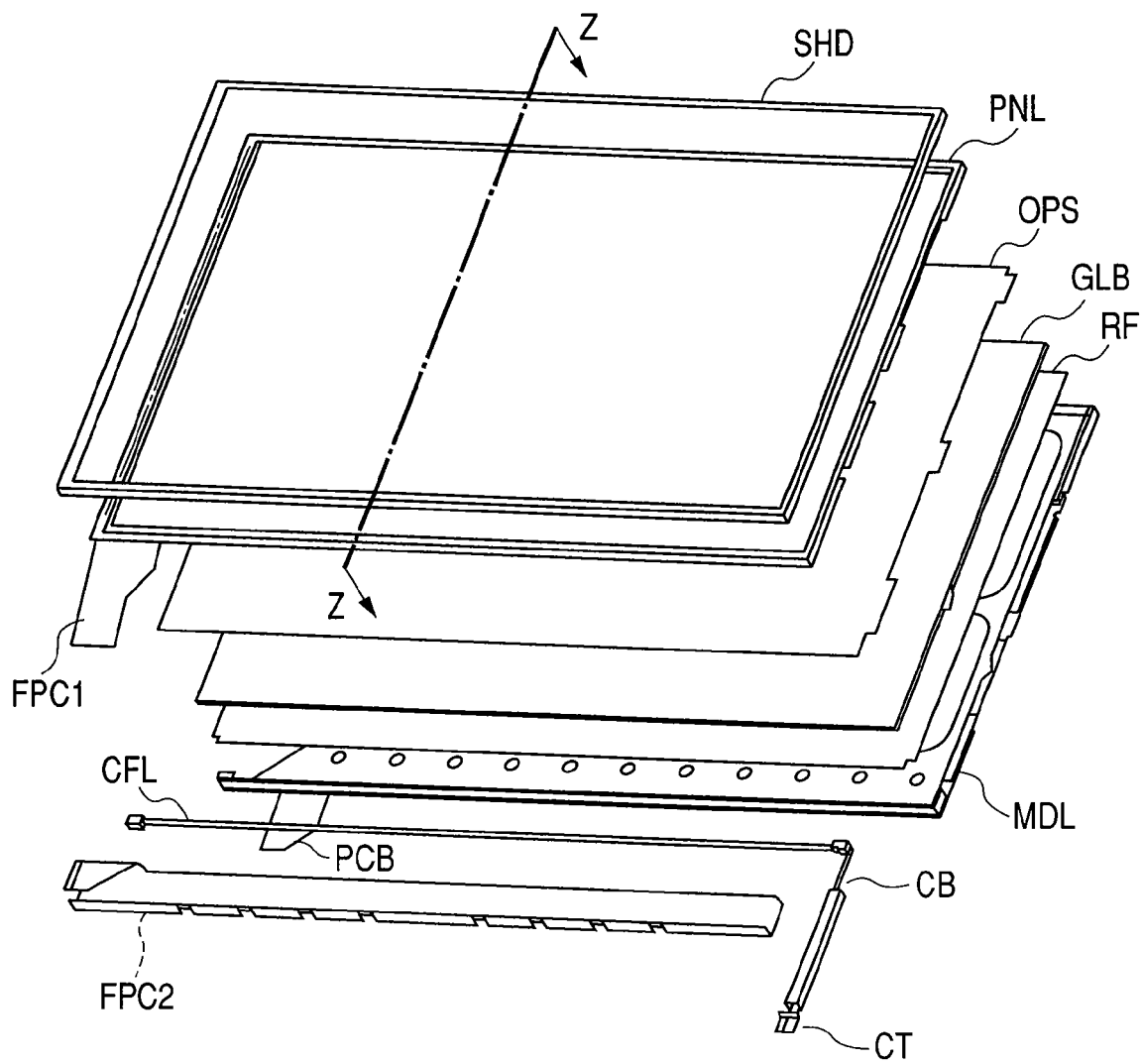
FIG. 16 is an exploded perspective view for explaining the construction of a liquid crystal display device as a first example of an image display device of the present invention.
Figure 17:
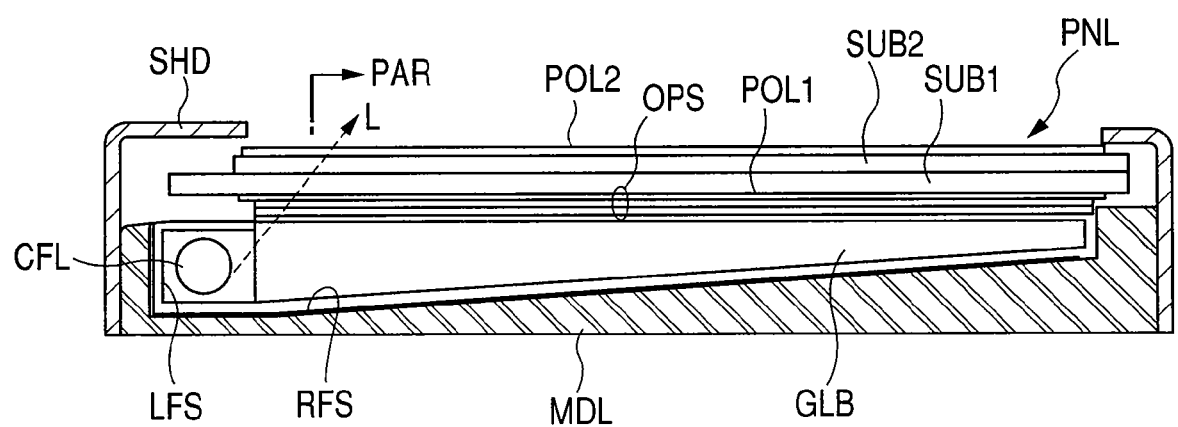
FIG. 17 is a sectional view taken along the line z-z of FIG. 16.

FIG. 16 is an exploded perspective view for explaining the construction of a liquid crystal display device as a first example of an image display device of the present invention. FIG. 17 is a sectional view taken along the line z-z of FIG. 16. The image display device is a liquid crystal display constructed using the active matrix substrate described previously. In FIGS. 16 and 17, the reference symbol PLN designates a liquid crystal cell with liquid crystal filled in the gap in which an active matrix substrate SUB1 and an opposing substrate SUB2 are stuck together, and polarizing plates POL1 and POL2 are laminated on its surface and back, respectively. The reference symbol OPS designates an optical compensating member comprising a diffusion sheet and a prism sheet: GLB, a light guiding plate; CFL, a cold cathode fluorescent lamp; RFS, a reflection sheet; LFS, a lamp reflection sheet; SHD, a shield frame; and MDL, a molding case.

An alignment film is formed on the active matrix substrate SUB1 on which thin-film transistors having any construction of the embodiments described previously are formed, and alignment regulating force is imparted to the alignment film by rubbing or other methods. After sealant is formed in the periphery of the pixel display region PAR, the opposing substrate SUB2 on which an alignment film layer is formed is disposed in opposed relation across a specific gap, liquid crystal is filled in the gap, and the sealing port of the sealant is closed by a sealing material. The polarizing plates POL1 and POL2 are laminated on the surface and back of the liquid crystal cell PNL thus constructed, and the liquid crystal display is fabricated by mounting a back light comprising the light guiding plate GLB and the cold cathode fluorescent lamp CFL, and the like via the optical compensating member OPS.

A driving circuit in the periphery of the liquid crystal cell is supplied with data and timing signals via flexible printed boards FPC1 and FPC2. The reference symbol PCB is provided with an external signal source, and a timing controller that converts display signals inputted from the external signal source into a signal format for displaying on the liquid crystal display device between the flexible substrate FPC1 and FPC2.

The liquid crystal display that uses the active matrix substrate of this construction example can drive its peripheral circuits at low voltages by disposing thin-film transistors free of the above-described edge current component in the peripheral circuits, thereby reducing power consumption.

Figure 18:
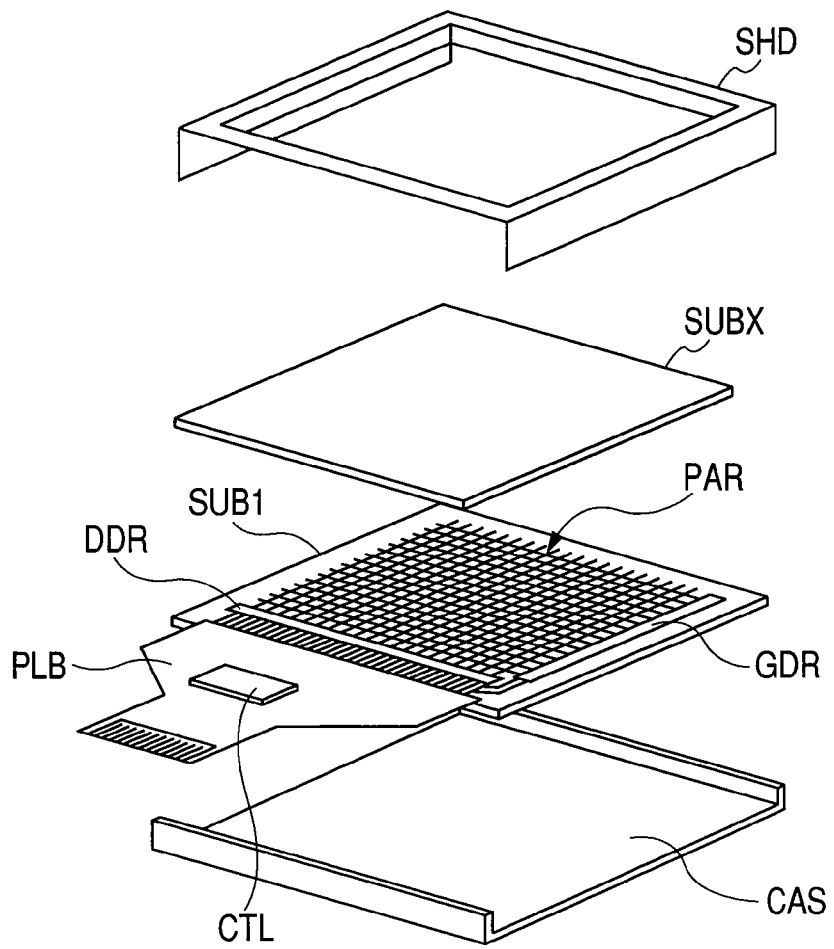
FIG. 18 is an exploded perspective view for explaining the construction of an organic EL display device as a second construction example of the image display device of the present invention.
Figure 19:
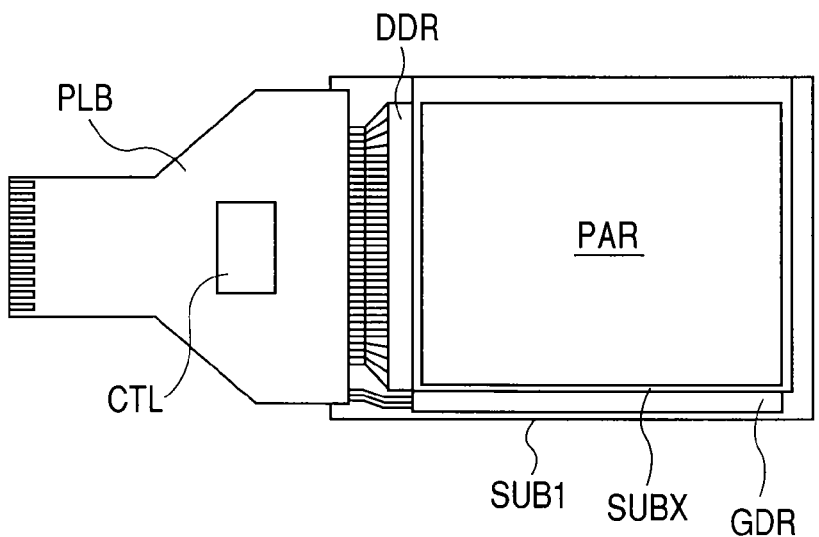
FIG. 19 is a plan view of an organic EL display device into which components shown in FIG. 18 are integrated.

An organic EL display device can be fabricated using the active matrix substrate of this embodiment. FIG. 18 is an exploded perspective view for explaining the construction of an organic EL display device as a second construction example of the image display device of the present invention. FIG. 19 is a plan view of an organic EL display device into which components shown in FIG. 18 are integrated. Organic EL elements are formed on electrodes within pixels on an active matrix substrate SUB1 of any of the embodiments described previously. The organic EL element comprise a laminate obtained by evaporating a hole transport layer, a light emitting layer, an electron transport layer, and a cathode metallic layer in this order on an electrode surface within a pixel. A sealant is disposed in the periphery of the pixel region PAR of the active matrix substrate SUB1 on which such laminated layers are formed, and sealed by a sealing substrate SUBX or a sealing can. Protection films may be used in place of these.

The organic EL display device supplies display signals from an external signal source to driving circuit regions DDR and GDR of its external circuit on a printed board PLB. An interface circuit chip CTL is mounted on the printed board PLB. The organic EL display device is unified by a shield frame SHD of an upper case and a lower case CAS.

As described above, since thin-film transistors used in the image display part use a conventional thin-film transistor structure, aperture ratio does not decrease and display capability does not deteriorate. The present invention can achieve both reduction in power consumption and maintenance of display capability of an image display device driven using top gate type thin-film transistors.

What is claimed is:

1. A thin-film transistor comprising:
an insular semiconductor thin film formed insularly on a glass substrate;
a gate insulating film on the insular semiconductor thin film and the glass substrate;
a gate electrode on the gate insulating film;
a branch closed circuit that branches from the gate electrode; and
a source electrode and a drain electrode formed on the insular semiconductor thin film,
wherein the branch closed circuit lies along and includes an outer portion which extends downward below the gate electrode in a cross-sectional view to cover a contour of the insular semiconductor thin film, and
wherein a width of the branch closed circuit is wider than a width of an overlap between the insular semiconductor thin film and the branch closed circuit.

2. The thin-film transistor according to claim 1, further comprising a plurality of source electrodes or a plurality of drain electrodes on the insular semiconductor thin film surrounded by the gate electrode and the branch closed circuit.

3. The thin-film transistor according to claim 1, wherein the branch closed circuit covers the gate insulating film on the insular semiconductor thin film and the gate insulating film on the glass substrate.

4. The thin-film transistor according to claim 1, wherein the branch closed circuit operates to reduce or eliminate an edge current path at intersections in plan view between the gate electrode and edges of the insular semiconductor thin film in plan view.

5. The thin-film transistor according to claim 1, wherein the branch closed circuit covers an edge contour of the insular semiconductor thin film in plan view and in cross-sectional view.

* * * * *